United States Patent [19]

Skalka

[11] 4,345,206
[45] Aug. 17, 1982

[54] FREQUENCY AND FREQUENCY ERROR COUNTING IN TEST APPARATUS

[75] Inventor: Robert J. Skalka, Mesa, Ariz.

[73] Assignee: Motorola Inc., Schaumburg, Ill.

[21] Appl. No.: 158,098

[22] Filed: Jun. 10, 1980

[51] Int. Cl.³ .......................................... G01R 23/14
[52] U.S. Cl. ............................... 324/79 R; 324/79 D
[58] Field of Search ................. 324/78 R, 78 Z, 79 R, 324/79 D

[56] References Cited

U.S. PATENT DOCUMENTS

| | | | |
|---|---|---|---|
| 3,372,339 | 3/1968 | Harrison et al. | 324/79 R |
| 3,838,338 | 9/1974 | Khoury | 324/79 D |
| 3,978,403 | 8/1976 | Mansfield | 324/79 R |
| 4,063,169 | 12/1977 | Palmer | 324/79 D |
| 4,074,191 | 2/1978 | Jules | 324/79 R |

Primary Examiner—Michael J. Tokar
Attorney, Agent, or Firm—Eugene A. Parsons

[57] ABSTRACT

Test apparatus designed to be coupled to a transmitter including a local oscillator and mixer for reducing the received carrier frequency, a frequency counter for counting the IF cycles, a subtractor for subtracting the counted value from the actual value of the desired frequency, time averaging circuitry for finding the average error in a plurality of counts and display means for displaying the average error. The frequency counter is a gate time counter which normally counts for a one-tenth second period but increases the counting time to one second when the error is reduced below ±10 Hertz.

12 Claims, 2 Drawing Figures

FREQUENCY AND FREQUENCY ERROR COUNTING IN TEST APPARATUS

BACKGROUND OF THE INVENTION

In test apparatus and the like, one of the major functions is the ability to accurately measure frequencies, as for example from adjacent or remote transmitters, and to tune the transmitter or other source of frequency to remove frequency errors. In many instances, it may be desirable to simply measure the frequency error as, for example, in frequency modulation. In the use of FM transmitters it is often desirable to measure the deviation of the carrier frequency from the base frequency to determine the extent of modulation and whether or not the modulation is linear, or symmetrical, about the base frequency.

SUMMARY OF THE INVENTION

The present invention pertains to improved test apparatus wherein the carrier frequency of a transmitter or other source of frequency is coupled to a mixer and local oscillator to reduce the carrier to an intermediate frequency, which intermediate frequency is filtered and counted. The count of the intermediate frequency is compared to a known count for an errorless intermediate frequency and the difference or error is supplied to a time averaging circuit. The time averaging circuit averages a plurality of errors to eliminate the effects of frequency modulation, if such modulation is present, and the average error is indicated or displayed for the operator. Normally, the counter counts the IF frequency for a period less than one second and, if the frequency source is being tuned or the error is being removed in some other way, a comparator senses the output of the subtractor or averaging circuit and increases the counting period to one second when the error is reduced to a predetermined range.

It is an object of the present invention to provide new and improved test apparatus.

It is a further object of the present invention to provide new and improved test apparatus for measuring and controlling the frequency of a frequency source.

It is a further object of the present invention to provide new and improved test apparatus incorporating simplified and less expensive circuitry.

These and other objects of this invention will become apparent to those skilled in the art upon consideration of the accompanying specification, claims and drawings.

BRIEF DESCRIPTION OF THE DRAWINGS

Referring to the drawings.

PRIOR ART

Figure 1:
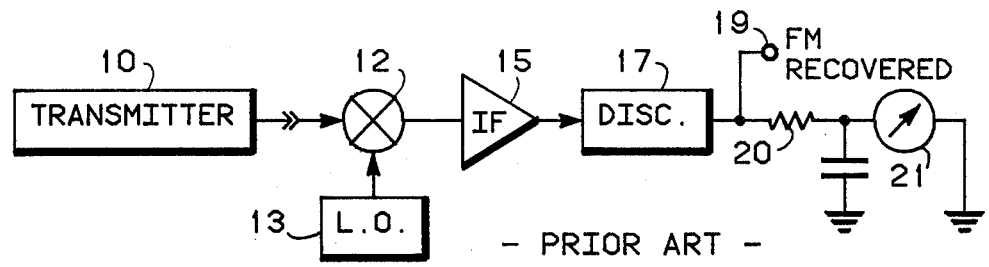
FIG. 1 is a simplified block diagram of prior art structure for counting frequency errors.

Referring specifically to FIG. 1, the number 10 generally indicates a source of frequency to be tested, which in this embodiment will be illustrated as a transmitter. The output or carrier frequency of the transmitter 10 is coupled to a mixer 12, which coupling may be by means of a direct connection as shown or, if the transmitter 10 is located remotely from the test equipment, by means of receiving the transmission through a receiver. A local oscillator 13 is also connected to the mixer 12 to reduce the carrier frequency applied thereto to an intermediate frequency. Since the test equipment will normally be used to test the same type of equipment, for example commercial transceivers and the like, the intermediate frequency will generally be fixed and known in advance. The intermediate frequency from the mixer 12 is coupled through an amplifier 15 to a discriminator 17. The discriminator 17 provides recovered FM at a terminal 19 for other tests and also supplies a voltage through a low pass filter 20 to an error indicator, which in this illustration is a meter 21.

As is well known in the art, the discriminator 17 theorically operates linearly on either side of a center frequency and the error voltage indicated by the meter 21 is representative of the amount of error, or deviation, from the center frequency. However, constructing a discriminator for sufficient accuracy to operate in test equipment is relatively costly and difficult.

DESCRIPTION OF THE PREFERRED EMBODIMENT

Figure 2:
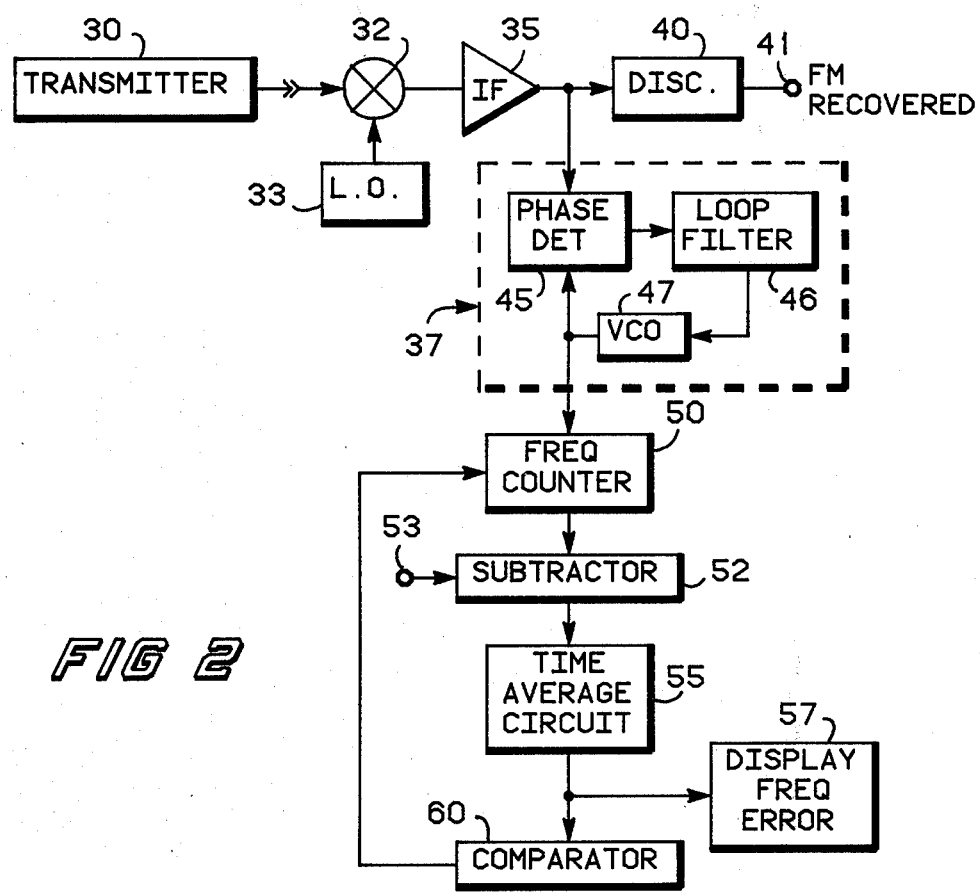
FIG. 2 is a simplified block diagram of apparatus for counting frequency errors incorporating the present invention.

Referring specifically to FIG. 2, a source of frequency to be tested, transmitter 30 in this example, is coupled to one input of a mixer 32, which coupling may be direct if the transmitter 30 is located locally or through a receiver if the transmitter 30 is located remotely. A local oscillator 33 is also connected to the mixer 32 to reduce the received carrier frequency a predetermined amount which, if the received carrier frequency is correct or errorless, will be a predetermined intermediate frequency. The intermediate frequency from the mixer 32 is amplified in an amplifier 35 and applied to a filter, generally designated 37. The output of the amplifier 35 may also be supplied to a discriminator 40 for providing recovered FM at an output terminal 41.

While the filter 37 may be any convenient filter form removing interference and other extraneous signals, in this preferred embodiment it includes a phase locked loop. The output of the amplifier 35 is applied to a phase detector 45. The control signal from the detector 45 is supplied through a loop filter 46 to the control input of a voltage control oscillator 47. The output of the oscillator 47 is supplied to a second input of the detector 45 for comparison to the output of the amplifier 35. The output of the oscillator 47 is also supplied to a frequency counter 50.

The frequency counter 50 may be any of a variety of frequency counters, most of which are commercially available, and may be, for example, the counter generally referred to as a gate time counter. In the operation of this type of counter a gate of predetermined length or time period is applied to the counter and the counter counts pulses as long as the gate is present. Generally the counting gate will be applied to the counter periodically so that a count of cycles per unit of time is supplied at predetermined periods. In the present embodiment the frequency counter 50 is a gate time counter which has two modes of operation. In the first mode of operation a one-tenth of a second gate is applied periodically to the counter 50 so that a count representative of the number of the cycles per one-tenth of a second is available at the output. Generally this count will be a digital signal and the number of cycles per second can easily be obtained by adding a zero in the tenths-unit position of the number.

In the second mode of operation the frequency counter 50 receives a gate which is one second in duration so that a full count is obtained. Since the counter 50 is normally constructed to provide a count representative of the number of cycles per one-tenth of a second with the final zero being understood, when the counter is switched to the second mode of operation the most significant bit of the output signal will be lost. It will of course be understood that a counter having additional modes of operation can be utilized with the additional modes incorporating gates of less than one second. For example, a three mode counter might use gates of one-hundredth of a second, one-tenth of a second and one second. By counting for periods substantially less than one second and by using a counter with only sufficient capacity to just contain the intermediate frequency count, the counter 50 can be greatly simplified and, therefore, less expensive.

The counts from the counter 50 are supplied to a subtractor 52. An exact count for the desired intermediate frequency is also supplied to the subtractor 52 by means of an input 53, or the subtractor 52 may simply be a comparator with the exact count already incorporated therein. In many instances it may be desirable to alter the equipment to measure frequencies utilizing a different intermediate frequency and, in these instances, the input 53 to the subtractor 52 should be available to receive the actual count. The subtractor 52 provides an output count which is the difference between the count from the counter 50 and the actual count supplied to the subtractor 52 at the terminal 53. This difference count is supplied to a time averaging circuit 55 which may include, for example, an updateable memory or the like so that a plurality of error counts from the subtractor 52 are averaged to periodically supply an average error count at the output thereof. In the present embodiment the subtractor 52 and time averaging circuit 55 are incorporated in a commercially available microprocessor which can quickly and inexpensively provide the functions described. It will of course be understood by those skilled in the art that separate subtractor and time averaging circuits are available but much of the advantages in cost and simplicity may be lost.

Generally, the signal coupled to the test apparatus from the transmitter 30 will be a frequency modulated carrier and, as is well known in the art, frequency modulation causes the carrier to deviate from a center or carrier frequency. By time averaging the error signals from the subtractor 52 in the circuit 55 the effect of the frequency modulation is substantially eliminated and the output signal from the circuit 55 is generally a count of the number of Hertz the center frequency is from the predetermined or desired count applied to the terminal 53. The average count at the output of the circuit 55 is applied to indicating means, which in this embodiment is a digital display 57. The display 57 is constructed to digitally display the difference between the received frequency from the transmitter 30 and the actual or desired frequency in terms of Hertz. It will of course be understood that the display 57 could be a meter of flashing light as in some prior art error indicators.

The output of the circuit 55 is also supplied to a comparator 60 which is preset to incorporate a range of counts. For example, in this embodiment the comparator incorporates a range of counts from +10 Hertz to −10 Hertz. With the frequency counter 50 operating in the first mode the most accurate count available is ±10 Hertz. That is, if the transmitter 30 is being tuned the circuit 55 will indicate zero error when the transmitter 30 is within the range of ±10 Hertz. When the comparator 60 senses a zero output from the circuit 55 (within the range of ±10 Hertz) a signal is supplied to the frequency counter 50 to control it to the second mode of operation. The frequency counter 50 then counts for a full second but the most significant bit is lost in the output. Since the error is within the range of ±10 Hertz the most significant bit is known and the loss thereof in the output of the counter 50 has no consequence in the operation. Thus, the transmitter 30 can be tuned to zero error with the simplified counter 50. It will of course be understood that the comparator 60 might also be connected directly to the output of the subtractor 52 to provide an indication of the error in the instant count as opposed to the average count.

Thus, test apparatus is disclosed wherein a count or indication of frequency error in signals from a frequency source is provided to allow tuning or other testing of the frequency source. The test apparatus is greatly simplified over prior art structures in that the components are commercially available and do not require excessive complexity or accuracy. The subtractor 52, time averaging circuit 55 and comparator 60 are easily constructed from commercially available microprocessors and the frequency counter 50 is greatly simplified over full range counters.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. Test apparatus designed to be coupled to a transmitter to be tested, for receiving output signals therefrom and providing an indication of carrier frequency error or deviation, said apparatus comprising:
    (a) a local oscillator and mixer for reducing the received carrier frequency by a predetermined frequency;
    (b) filtering means connected to said mixer for receiving output signals therefrom and filtering the signals to obtain the reduced carrier frequency substantiall interference free;
    (c) a frequency counter connected to said filtering means for receiving the filtered reduced carrier frequency and providing a count of cycles per unit of time;
    (d) a subtracting circuit, including means for introducing a predetermined number of cycles per unit of time for a preselected intermediate frequency, coupled to receive the count for the reduced carrier frequency and providing an output signal indicative of the difference between the reduced carrier frequency and the intermediate frequency; and
    (e) indicating means coupled to receive the output signal from said subtracting circuit and provide an indication of the frequency error or deviation between the reduced carrier frequency and the intermediate frequency.

2. Test apparatus as claimed in claim 1 wherein the filtering means includes a phase locked loop.

3. Test apparatus as claimed in claim 1 wherein the indicating means includes a digital display device.

4. Test apparatus as claimed in claim 1 including in addition time averaging circuitry connected to the subtracting circuit for receiving a plurality of output signals and providing an output signal which is an average of the plurality of counts, the output signal of said time averaging circuitry being connected to the indicating means.

5. Test apparatus as claimed in claim 4 wherein the time averaging circuitry and the subtracting circuit are incorporated in a microprocessor.

6. Test apparatus as claimed in claim 4 wherein the frequency counter is a gate time counter having a first, normal mode of counting of approximately one-tenth second gates and a second mode of counting of approximately one second gates.

7. Test apparatus as claimed in claim 6 including in addition a comparator connected to the time averaging circuitry and providing a control signal when the frequency error is in the range of +10 Hertz to −10 Hertz, the control signal being coupled to the frequency counter for controlling the counter from the first mode to the second mode.

8. Test apparatus designed to be coupled to a source of frequency error for counting the cycles per unit of time, the apparatus comprising:
(a) controllable gate timer counter means having a first mode of operation wherein said counter means counts cycles for a first period of time and a second mode of operation wherein said counter means counts cycles for a second period of time substantially longer than the first period of time;
(b) comparator means connected to receive the count in said counting means and provide a control signal thereto for maintaining said counter means in the first mode of operation as long as the count exceeds a predetermined range and controlling said counter means to the second mode of operation when the count falls within the predetermined range.

9. Test apparatus as claimed in claim 8 wherein the counter means is constructed to count cycles for one-tenth of a second in the first mode of operation and one second in the second mode of operation.

10. Test apparatus as claimed in claim 9 wherein the comparator means is constructed to control the counter means to the second mode of operation when the count falls within the range of +10 Hertz to −10 Hertz.

11. A method of substantially reducing the frequency error of a tuneable source of frequency, the method comprising the steps of:
(a) counting the cycles in the output of the source for a first period of time substantially less than one second;
(b) comparing the count to a predetermined count for the desired frequency to determine the frequency error;
(c) tuning the source to reduce the error;
(d) counting the cycles in the output of the source for a second period of time substantially greater than the first period of time when the frequency error is reduced to within a range approximately including units of frequency not included in the previous counting steps;
(e) comparing the count to a predetermined count for the desired frequency to determine the frequency error; and
(f) tuning the source to reduce the error to substantially zero.

12. A method as claimed in claim 11 wherein the period of time substantially less than one second is one-tenth of a second and the range is +10 Hertz to −10 Hertz.

* * * * *